US006950528B2

(12) United States Patent
Fischer

(10) Patent No.: US 6,950,528 B2
(45) Date of Patent: Sep. 27, 2005

(54) METHOD AND APPARATUS FOR SUPPRESSING AN ACOUSTIC INTERFERENCE SIGNAL IN AN INCOMING AUDIO SIGNAL

(75) Inventor: Eghart Fischer, Schwabach (DE)

(73) Assignee: Siemens Audiologische Technik GmbH, Erlangen (DE)

( * ) Notice: Subject to any disclaimer, the term of this patent is extended or adjusted under 35 U.S.C. 154(b) by 0 days.

(21) Appl. No.: 10/809,751

(22) Filed: Mar. 25, 2004

(65) Prior Publication Data

US 2004/0240682 A1 Dec. 2, 2004

(30) Foreign Application Priority Data

Mar. 25, 2003 (DE) ........................................ 103 13 330

(51) Int. Cl.[7] ........................... H03R 3/00; H04B 15/00
(52) U.S. Cl. ........................... 381/92; 381/91; 381/94.1
(58) Field of Search ............................ 381/92, 91, 122, 381/94.1, 94.7, 111, 123, 356, 119; 369/4; 700/94

(56) References Cited

U.S. PATENT DOCUMENTS 4,536,887 A * 8/1985 Kaneda et al. ................ 381/92
4,696,043 A * 9/1987 Iwahara et al. ............... 381/92
4,703,506 A * 10/1987 Sakamoto et al. ............ 381/92
5,471,538 A * 11/1995 Sasaki et al. ................. 381/92
5,473,701 A 12/1995 Cezanne et al. .............. 381/92
5,627,799 A * 5/1997 Hoshuyama ................ 367/121
5,825,898 A * 10/1998 Marash ........................ 381/92
5,978,490 A * 11/1999 Choi et al. .................... 381/92
6,041,127 A * 3/2000 Elko ........................... 381/92
6,049,607 A * 4/2000 Marash et al. ......... 379/406.08
6,766,029 B1 * 7/2004 Maisano ..................... 381/313
6,836,243 B2 * 12/2004 Kajala et al. ............... 342/377
6,865,275 B1 * 3/2005 Roeck ......................... 381/92
2002/0048376 A1 4/2002 Ukita
2004/0258255 A1 * 12/2004 Zhang et al. ................. 381/92

FOREIGN PATENT DOCUMENTS

DE 199 27 278 12/2000
EP 0 820 210 8/1997
WO WO 03/009636 1/2003

* cited by examiner

*Primary Examiner*—Xu Mei
(74) *Attorney, Agent, or Firm*—Schiff Hardin LLP

(57) ABSTRACT

In order to suppress at least one interference signal in an incoming audio signal using a directional microphone system having at least two microphones, that directional microphone signal which has the lowest interference signal component is selected from two or more directional microphone signals that have been produced by weighted combination from the signals of the microphones, with the weighting in each case determining a direction-dependent sensitivity. If a sensitivity distribution has a minimum in the direction of the interference signal source, then a low signal energy is detected, which characterizes a lower interference signal component.

15 Claims, 4 Drawing Sheets

METHOD AND APPARATUS FOR SUPPRESSING AN ACOUSTIC INTERFERENCE SIGNAL IN AN INCOMING AUDIO SIGNAL

BACKGROUND OF THE INVENTION

1. Field of the Invention

The present invention concerns a method for suppressing at least one acoustic interference signal by using a directional microphone system that has at least two microphones, and to an apparatus for implementing the method.

2. Description of the Prior Art

The matching of microphones in a directional microphone system is of significant importance for the suppression of interference signals.

In the case of steady-state matching, the microphones in a directional microphone system are matched to one another in the steady state in open air. This matching process is generally carried out using a measurement device that allows amplitude matching and phase matching of the individual, generally omnidirectional, microphones to be carried out. Steady-state matching allows a diffuse interference sound field to be eliminated from the directional microphone signal. Matching which is carried out in open air, however, is partially corrupted again by the influence of the head on the sound propagation during operation of a directional microphone system which is used, for example, in a hearing aid.

Additionally or alternatively, adaptive amplitude and phase matching algorithms have been proposed and are being used, which carry out the matching process continuously while the hearing aid is being worn and thus take into account the influence of the head on the reception of acoustic signals. The parameters in these algorithms are essentially two factors, an amplitude factor and a phase offset between the two microphone signals. Factors such as these also are used on a frequency-band specific basis. The algorithms on average, that is to say for diffuse interference sound, achieve matching that is as good as possible.

German PS 199 27 278 discloses a method for matching microphone of a hearing aid, as well as a hearing aid for representing the method. In this case, a hearing aid with a number of microphones which are connected to one another in order to produce a directional characteristic are ensonified in a suitable measurement area, and the directional characteristic is recorded, while the hearing aid is being worn. Filter parameters that are obtained from this can be supplied to configurable filters, which are connected downstream from the microphones, and the desired ideal directional characteristic can thus be approximated taking into account the individual characteristics when the hearing aid is being worn. The method makes it possible to produce filter parameters for amplitude and/or phase response matching of the signals, which are recorded by the microphones, in order to optimize the directional characteristic of the microphones.

SUMMARY OF THE INVENTION

An object of the present invention is based to provide a method and an apparatus, by means of which the influence of an acoustic interference signal on the reception of a directional microphone system can be suppressed as a function of the direction.

This object is achieved according to the invention by a method for suppressing at least one interference signal using a directional microphone system that has at least two microphones, with a number of directional microphone signals produced by weighted combination of signals from the at least two microphones, with the weighting in each case determining a direction-dependent sensitivity of the directional microphone system. The directional microphone signals are normalized with respect to an identical sensitivity of the directional microphone system in one direction region. The normalized directional microphone signal with the lowest interference signal component is selected as the output directional microphone signal. By the weighted combination, it is possible, for example, to achieve a delay using a phase factor, and to achieve an amplitude change by means of an amplitude factor.

In the method, a number of directional microphone signals are produced which are influenced to different extents by the interference signal due to their different direction-dependent sensitivities.

If the interference signal is located in a direction in which the sensitivity of the directional microphone signal that is produced by the weighting is high, then the directional microphone signal will include a large interference signal component. If the interference signal is, by contrast, located in a direction in which the sensitivity of the directional microphone signal that is produced by the weighting is small, then the interference signal component in the directional microphone signal is low.

One precondition for comparison of the directional microphone signals is that the sensitivity of all the directional microphone signals is the same in one direction region. This direction region in the case of a directional microphone system which is used, for example, in a hearing aid is preferably the straight-ahead direction, and is normally designated by 0°. Since, for example, two microphones produce a relatively broad first-order directional lobe, it is advantageous to average the sensitivity of the directional microphone system in a narrow or broad range, for example in the forward direction, depending on the technical characteristics. In the simplest case, only the signal in the 0° direction is considered. The directional microphone signals that are produced are normalized with respect to an identical sensitivity in this direction region.

The directional microphone signal with the lowest interference signal component is selected as the output directional microphone signal from the directional microphone system. In this case, the contribution of the interference signal to the directional microphone signal resulting from the normalized sensitivity in the direction region is, for example, characterized by the signal energy. A low signal energy means that the sensitivity of the directional microphone signal to the interference signal is low, so that there is also a small interference component in the directional microphone signal. Alternatively, it would be possible to determine the interference signal component, for example, by means of a signal level, a voltage produced by the signal, by the magnitude of the signal, or else by a signal-to-noise ratio of the directional microphone signals.

A further advantage of the method is the direction-dependent suppression of an interference signal, since the method makes it possible to deliberately filter from the directional microphone signal interference signals that are received from the direction with a minimum sensitivity.

The method is based on the capability to determine the sensitivity of the directional microphone system by weighted combination of the signals from the microphones in the directional microphone system.

In an embodiment of the method, the weighting is determined so as to minimize the sensitivity of the directional microphone system for an interference signal source that is located in one direction with respect to the directional microphone system. The more accurately the sensitivity minimum can be placed in one direction the more accurately the interference signals from localized interference signal sources can be suppressed.

In another embodiment of the method, the weighting is determined by taking into account an effect from the acoustic environment, which occurs as a result of the use of the directional microphone system. For example, the weighting in the case of a directional microphone system which is used in a hearing aid is determined when the hearing aid is being worn, that is to say the directional microphone system is arranged on a head or on a head imitation in a constellation corresponding to that in use when determining the weighting.

In order to determine a weighting, a signal source which is located in one direction with respect to the directional microphone system is, for example, removed from the directional microphone signal as well as possible by variation of the weighting of the microphone signals. The weightings determined in this way have the advantage that they are produced in controlled conditions and with a fine resolution, in each case optimized to the incidence direction of the signal source.

In another embodiment of the method, the weighting has an amplitude factor and/or a phase factor, in particular for the correction of the amplitude or phase, respectively, of one of the microphone signals. The weighting can be stored, for example in the form of the amplitude factor and/or phase factor, and can be stored, for example, as a frequency-dependent and direction-dependent characteristic. The various weightings can be read selectively from the memory in order to produce the directional microphone signals.

In one particularly fast-operating embodiment of the method, the various directional microphone signals are produced essentially at the same time.

In another embodiment, the value of the weighting during the production of the two or more directional microphone signals is changed in order to successively produce directional microphone signals with different direction-dependent sensitivities. This has the advantage that there is no need to simultaneously calculate a large number of directional microphone signals.

In a further embodiment of the method, the frequency range of the microphone signals is subdivided into frequency bands, in each of which the method according to the invention is carried out. This results in frequency-band-specific output directional microphone signals for each frequency band, which together form an output directional microphone signal from the directional microphone system for the entire frequency range.

The above-mentioned object of the invention also is achieved by an apparatus for implementing a method as described above, with a directional microphone system having at least two microphones.

In another embodiment of the apparatus, the two microphones are connected to respective frequency-selecting filter banks, at the outputs of which frequency band signal components of the microphone signals are produced. Outputs of the respective filter banks that are in the same frequency bands are connected in pairs to a unit that combines the frequency band signal components with a weighting, the weighting being applied by means of an amplitude unit, which varies the amplitude of the corresponding frequency band signal component, and/or by means of a phase unit which shifts the phase of the corresponding frequency band signal component. The amplitude unit and the phase act either jointly on one frequency band signal component or act individually on each of the frequency band signal components. Two or more combination units are connected to a comparison unit, which normalizes the directional microphone signals with respect to a sensitivity in a direction that is as identical as possible to the direction region of the signal and compares the respective interference signal components of the normalized directional microphone signals. The directional microphone signal with the smallest interference signal component is entitled as the output directional microphone signal at the output of the comparison unit.

DESCRIPTION OF THE PREFERRED EMBODIMENTS

Figure 1:
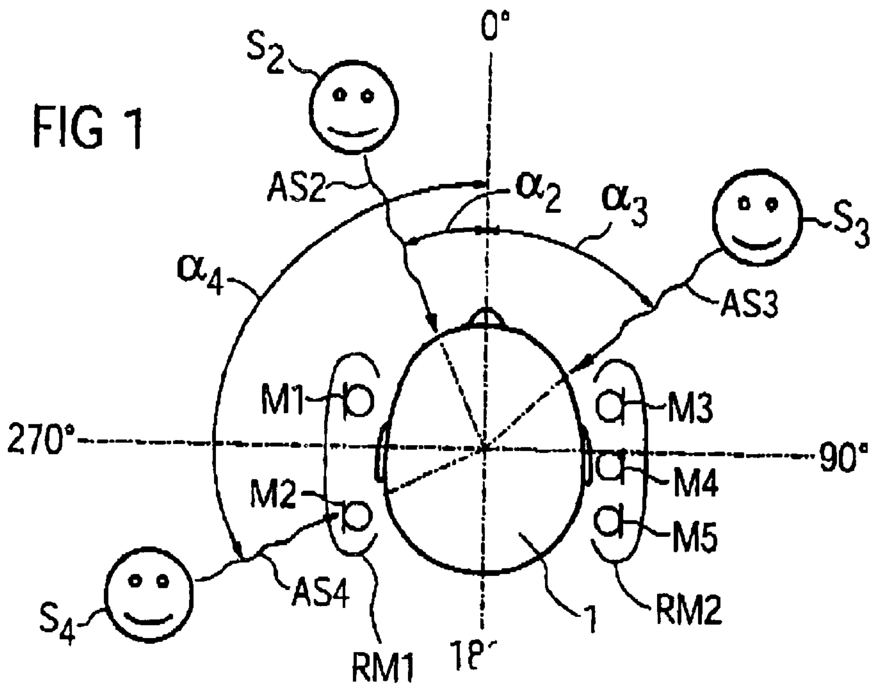
FIG. 1 shows a typical example of the use of a directional microphone system for the suppression of acoustic interference signals

FIG. 1 shows a typical example of the use of a directional microphone system RM1, RM2 for the suppression of acoustic interference signals. In this case, one or more directional microphone systems RM1, RM2 are located in a hearing aid, which is used as such by the person 1. The person 1 is having a conversation with a person S2, who is located in the direction region of the directional microphone system RM1, RM2. The direction region is in the straight-ahead direction, which is to say in the direction of the axis that is denoted by 0°. The discrepancy between the position of the person S2 and the 0° axis through the angle a2 is, for example, within a conical direction region of the directional microphone system RM1.

In addition to the person S2, there are two other people S3, S4 within the vicinity of person 1. The people, S3, S4 are conversing with one another, that is to say they represent interference signal sources which are located at respective angles of $\alpha 3$ and $\alpha 4$ with respect to the 0° axis and whose acoustic signals AS3, AS4 should not be received by the directional microphone system RM1.

The directional microphone system RM1 comprises two microphones M1, M2; the directional microphone system RM2 comprises three microphones M3, M4, M5. The hearing aids in which the directional microphone systems RM1. RM2 are contained may be hearing aids which are worn behind the ear or in the ear. Alternatively, further directional microphone systems can be produced by connecting the microphones M1, M2 on one side to one or more microphones, M3, M4, M5 on the other side.

In order to form a directional microphone signal, the signals from at least two microphones M1, . . . M5 are combined, if necessary with a delay and weighted with respect to one another. The directional microphone system has a different direction-dependent sensitivity, depending on the weighting.

A sensitivity distribution such as this is referred to as a directional characteristic of the directional microphone system and can be measured, for example, as follows. The directional microphone system is subjected to an acoustic signal at a constant amplitude, in which case the source of the acoustic signal can be moved around the directional microphone system. The received signal energy is recorded for different directions, that is to say different positions of the signal source. For the same weighting, it varies owing to the direction-dependent sensitivity of the directional microphone system.

A weighting for a specific sensitivity for a signal source that is located in one direction can be determined by means of a similar procedure. In this case the weighting is varied instead of varying the direction in which the signal source is located. The sensitivity of the directional microphone system is in this case set, for example, such that the signal which arrives at the directional microphone system from a constant direction is, for example, received at a minimum level, or is even entirely eliminated. If this is repeated for a number of directions, that is to say the position of the signal source is rotated once in, for example 5° angle steps around the directional microphone system, this results in a set of weightings, which each minimize a signal arriving from the corresponding direction.

Directional characteristics that are measured in the open air and have two microphones are symmetrical with respect to an axis that is defined by the connecting line between the two microphones. However, directional microphone systems are normally used in a specific acoustic environment, for example being worn on the head (FIG. 1) or on the body. The acoustic environment influences the sound propagation and, in a corresponding manner, the directional characteristics. For this reason, it is advantageous to carry out the weighted combination in order to produce the directional characteristics, which are used in the method in the respective acoustic environment, so that the weightings take account of the effect of the acoustic environment on the acoustic signals.

For the case of a directional microphone system which is installed in a hearing aid, in addition to the option of matching the microphones when they are not on the head of the respective hearing aid wearer, that is to say combining them with different weightings, it is also possible to carry out the matching process with the aid of a head simulation which, for example represents an average head.

The influence of the head on the propagation of sound waves that are intended to be received by a microphone that is worn on the head is determined by the so-called head-related transfer functions (HRTF). HRTFs such as these may be determined, for example, using the procedure described above, and can be used to calculate the weightings, which likewise lead to directional microphone signals with direction-dependent sensitivities.

Figure 2:
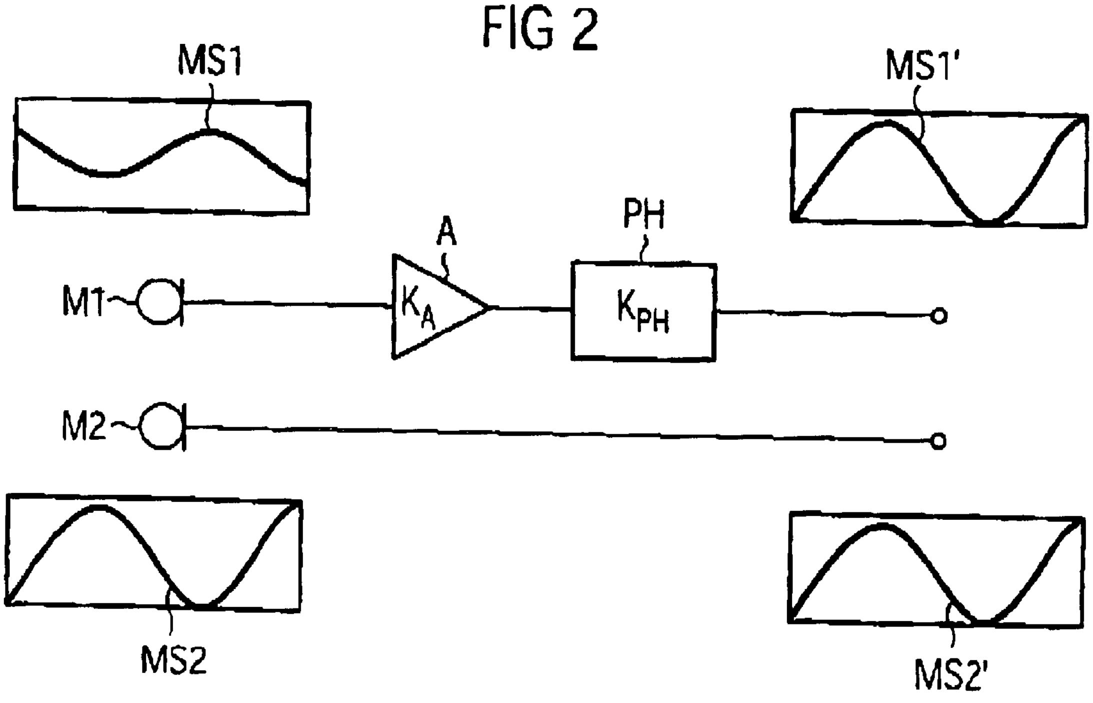
FIG. 2 shows the procedure for matching two microphone signals.

FIG. 2 shows, schematically, the weighted combination of two microphone signals MS1, MS2 from the microphone M1, M2. The signals MS1, MS2 differ in their amplitude and in their phase. The aim of matching the two microphones is firstly to match the amplitudes of the signals, MS1, MS2, and secondly to set a fixed phase relationship. The former is achieved, for example, by amplification by a fixed amplitude factor KA in an amplifier unit A. The latter is achieved, for example, with the aid of a phase shifter PH, which shifts the relative phase, which is intended to be 0° in FIG. 2, through the phase angle KPH.

The amplitude and phase correction may act on a microphone signal. This is the case in FIG. 2; both correction factors act on the microphone signal MS1 and produce a corrected microphone signal MS1'. This has the obvious advantage of simple design, in which only one signal is processed. Alternatively, the corrections may each act on one of the microphone signals.

Signal matching such as this is preferably carried out in one frequency band. For this purpose, the frequency range of the microphone signals is subdivided into a number of frequency bands, for using a filter bank. The amplitude and phase factors KA, KPH now themselves determine the direction-dependent sensitivity of the respectively produced directional microphone system in that, for example, they minimize the sensitivity in one direction in the corresponding frequency band. An unambiguous association between the minimum and one direction is now possible only in the case of an asymmetric sensitivity distribution, such as that which is produced, for example, by the influence of the head. In open air, by contrast, only symmetrical sensitivity distributions can be produced, which reflect the symmetry of the open air environment, and of the microphone arrangement.

The frequency-dependent and/or direction-dependent weightings for the method are stored in the directional microphone system in the form of frequency-dependent and/or direction-dependent characteristics or functions, or as data pairs.

Figure 3:
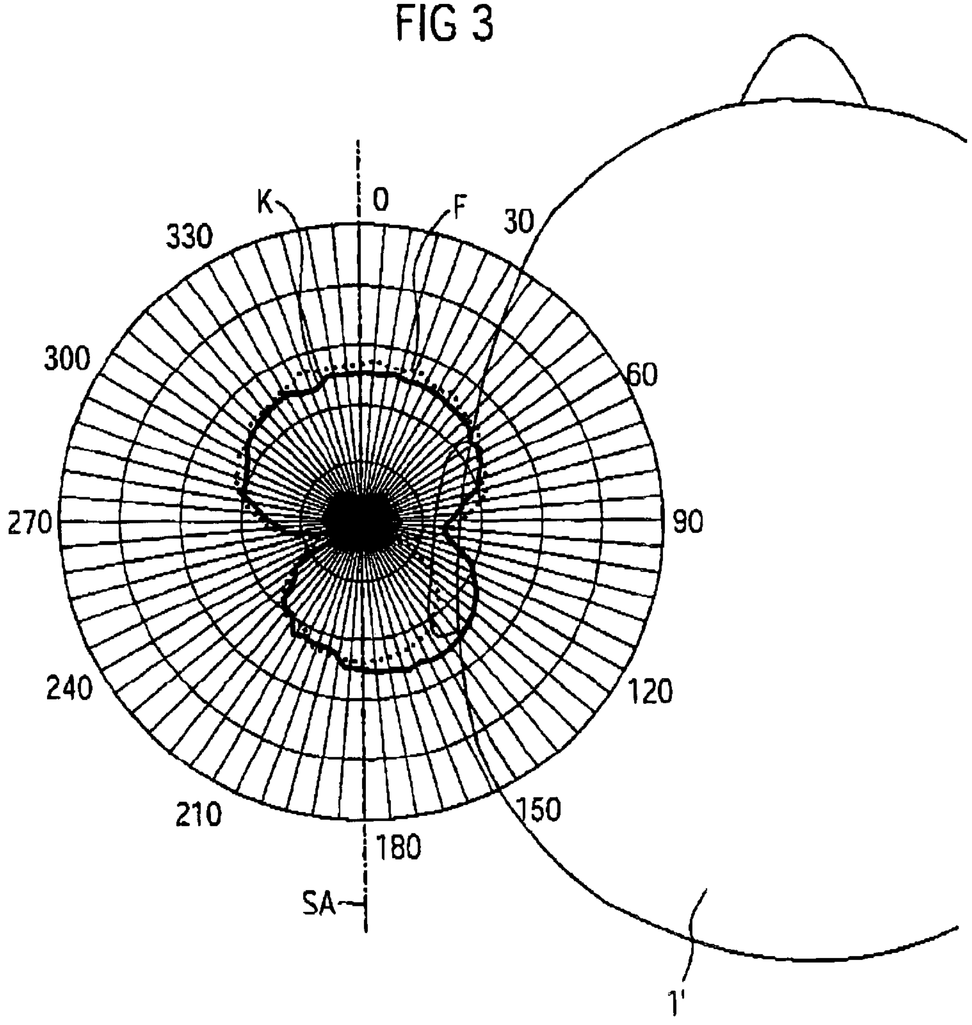
FIG. 3 shows a sensitivity distribution for a directional microphone system, which has been matched, in the open air, as well as a sensitivity distribution taking account of the head influence.

FIG. 3 shows two measured directional characteristics. In this case, the sensitivity, which is essentially proportional to the signal energy, is plotted radially over all the angles from 0 to 360° in 5° steps.

First, a directional characteristic F in open air is shown for an acoustic signal at 500 Hz. This clearly shows its symmetrical profile around the axis of symmetry SA that is defined by the connecting line between the directional microphones. Owing to the symmetry, the directional characteristic has two minima in the 120° and 240° directions.

In addition, FIG. 3 shows a directional characteristic K which takes account of the influence of a head 1', which is indicated, on the direction-dependent sensitivity of the directional microphone system. This clearly shows the pronounced minimum at 240°. The minimum on the side of the head 1' is loss pronounced in comparison with that in the open air. A directional microphone system whose weighting results in the directional characteristic K will receive an interference signal from the 240° region considerably attenuated.

Figure 4:
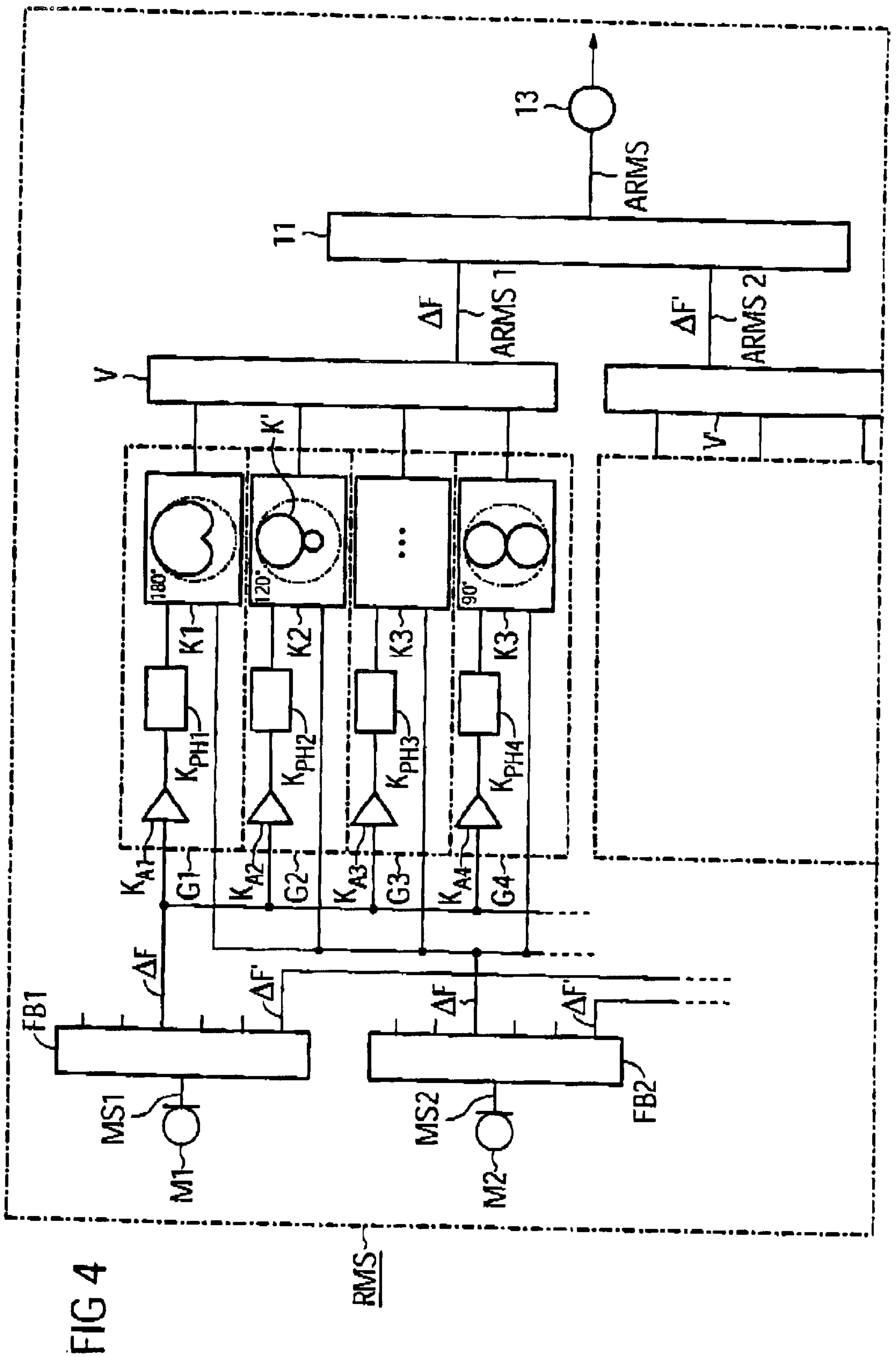
FIG. 4 is a schematic block diagram of an apparatus for implementing the method for suppression of at least one acoustic interference signal, according to the invention.

FIG. 4 shows, schematically, an example of an apparatus for implementing the method. The microphones M1, M2 are connected to a respective filter bank FB1 or FB2. A frequency band DF, DF' of the microphone signals MS1, MS2 is produced at the outputs of the respective filter banks FB1, FB2. Outputs with a matching frequency band DF, DF' are connected in pairs to a series of units G1, G2, G3, G4 which carry out a combination process with different weightings. This means that the microphone signal MS1 that is restricted to the frequency band AF, and the microphone signal MS2 that is restricted to the same frequency band, ΔF are available for weighted combinations.

The microphone signal MS1 in each case is matched to the signal from the microphone M2 in the units G1, G2, G3, G4, which carry out a combination process with different weightings, with the aid of an amplitude factor $K_{A1}$, $K_{A2}$, $K_{A3}$, $K_{A4}$ and of a phase factor $K_{PH1}$, $K_{PH2}$, $K_{PH3}$, $K_{PH4}$. The directional microphone signals RMS1, RMS2 are produced, for example, by forming the difference between the corrected microphone signal MS1 and the microphone signal MS2 in the combination units K1, K2, K3, K4. For illustrative purposes, the corresponding directional characteristics K' are shown schematically in the combination units K1, K2, K3, K4. In addition, the figure shows the direction in which the minimum of the directional characteristic is located, for example with the minimum for K' being at 120°.

The weighted combination can be carried out virtually at the same time or successively for all of the weightings. In the first case, all of the weightings must be provided at the same time by, for example, being prominently implemented in the directional microphone. In the second case, the directional microphone signals are produced successively. In this case, the weightings are, for example, read one after the other from a common memory, with the minimum of the directional characteristics being rotated once, for example, through 360° around the directional microphone system.

The outputs of the units G1, G2, G3, G4 that carry out a combination process with different weightings are connected to a comparison unit V. The comparison unit V compares the interference signal component contained in the directional microphone signals RMS1, RMS2. For this purpose, first, each of the directional microphone signals RMS1, RMS2 that are produced by the units G1, G2, G3, G4 which carry out a combination process with different weightings are normalized with respect to the same sensitivity in one direction region. For example, the sensitivity in the 0° direction of all the directional microphone signals RMS1, RMS2 is set to 1. The interference signal component may be compared, for example, on the basis of the signal level, of the signal energy or of the noise component in the signal. The better the extent to which the respective steady-state directional characteristic cancels out the interference signals which arrive at the microphones M1, M2, the lower is the signal energy or the signal level. That output directional microphone signal ARMS for the frequency band ΔF, which has the smallest interference signal component, is produced at the output of the comparison unit V.

An analogous procedure is carried out in all the other frequency bands ΔF'. In this case, specific amplitude factors and phase factors are used for weighted combinations.

The frequency-band-specific output directional microphone signals ARMS1, ARMS2 are supplied to a further combination unit 11, in which they are combined to form a single output directional microphone signal ARMS for the directional microphone system which is formed by the microphones M1, M2. This output directional microphone signal is supplied for further signal processing to a signal processing unit 13 which is, for example a hearing aid signal processing and in which a further algorithm is carried out in order to suppress interference signals or in order to amplify the signal as a function of the hearing damage of the wearer.

The method which is illustrated in FIG. 4 is based on the processing of microphone signals in the individual frequency bands ΔF, ΔF'. Alternatively, the microphone signals MS1, MS2 may be analyzed by means of a Fast Fourier Transformation (FFT) and the method may be applied in a corresponding manner to the FFT coefficients.

During the successive production of the directional microphone signals as mentioned above, the comparison unit V may, for example, influence the step width in the relevant direction region during the production process, and thus act adaptively on the weightings or the two or more directional microphone signals RMS1, RM2.

Figure 5:
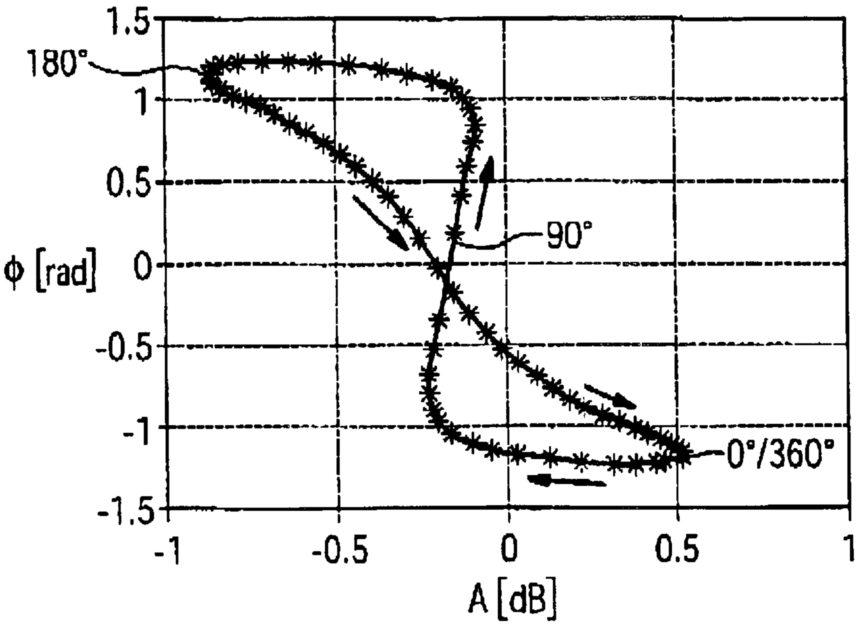
FIG. 5 shows a combined illustration of amplitude factors and phase factors in the 400 Hz frequency band for 5° angle steps.

FIG. 5 provides a summary of the examples of the values of the amplitude factors and phase factors for one frequency band. The amplitude factor A is plotted in one direction, and the phase delay Φ of the two microphone signals is plotted in the other direction. The amplitude factor A for 0° or 360° is, for example, about 0.5 dB. The associated phase Φ is about −1.2. Each small star corresponds to one pair of amplitude and phase factors A, Φ, which are indicated in 5° steps. This clearly shows the asymmetric profile of the factor distribution, resulting from consideration of the effect of the head on the sound propagation. By way of example, when a hearing aid is in use, the amplitude and phase factors A, Φ are used which are required for interference signal suppression of interference signals in the region from 90° to 270°.

Figure 6:
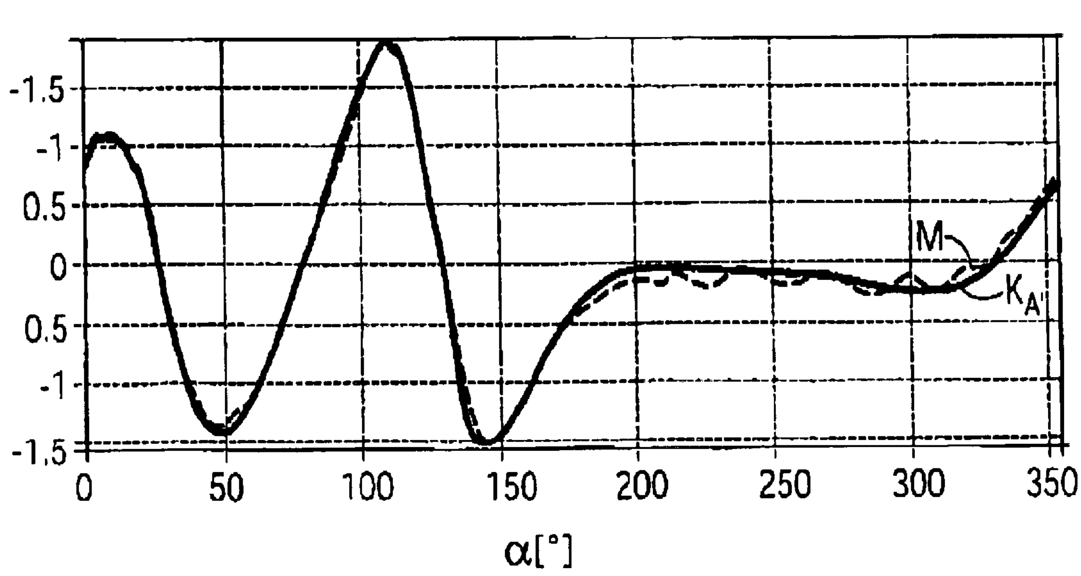
FIG. 6 shows a direction-dependent characteristic for an amplitude factor.

FIG. 6 shows an amplitude factor A' as a characteristic $K_{A'}$ which approximates the directional dependency of an amplitude factor A'. This shows of the one hand a structured measurement curve M of the amplitude factor A'. The measurement curve was recorded, for example, using the procedure described above for matching of the direction-dependent sensitivity, and describes the amplitude factors which produce a minimum sensitivity in the direction α from 0° to 360°. The characteristic $K_{A'}$ essentially reproduces the measurement curve, and is stored in the directional microphone system. Alternatively, the characteristic $K_{A'}$ could be calculated from the HRTFs.

One particularly advantageous procedure for interference signal suppression with the aid of the method according to the invention is carried out, for example, as follows. In this case, frequency-dependent and angle-dependent weightings are used, which additionally also take account of the influence of the head on the sound propagation:

An optimum steady-state sensitivity distribution (directional characteristic) is determined on a head or on a head simulation for each interference signal incidence direction, for example in the range from 90° to 270°, and in a number of frequency bands with sufficiently fine resolutions. Accordingly, f*a (where f is the number of frequency bands and a is the number of angle steps with this resolution) weightings are measured for the amplitude and phase response correction which, in the steady state, minimize the interference signals from the various interference signal incidence directions. This means that the weightings allow optimum suppression of an interference signal source that is active in the corresponding frequency band Δf and in the corresponding incidence direction. The values of the weightings (for example the amplitude factor A and the phase factor PH) are, for example, stored in the directional microphone system or are made available in the form of an angle-dependent characteristic function:

$$A_{\Delta f}=A_{\Delta f}(\text{angle}) \text{ and } PH_{\Delta f}=PH_{\Delta f}(\text{angle}).$$

They thus represent angle-dependent and frequency-dependent compensation for the head effect in the acoustic environment of the hearing aid.

Further adaptive amplitude or phase matching algorithms that may be used and have been described in the prior art may also be used. The weightings for them, that is to say for example the steady-state amplitude and phase matching factors, represent, for example, steady-state angle-dependent shifts (offsets). The direction matching is preferably linked to the adaptive amplitude and phase matching algorithms that have been mentioned.

Matching of the directional microphone in order to suppress the interference signals during operation is now carried out easily by means of the automated selection of that directional microphone signal which is at the lowest level and thus has the greatest interference signal attenuation. One precondition for this is the normalization, as discussed above, of the sensitivities of the individual directional characteristics and of the directional microphone systems in the desired direction.

One major advantage of the just-described procedure is that ft ensures that the directional microphone system is matched so as to suppress interference signals by means of optimum directional characteristics, which have previously been optimized in the steady state on the head. In this way, the weightings are always optimally matched to the respective interference signal source to be suppressed when the hearing aid is being worn. This procedure is considerably faster than a defective adaptation, behind the interference sound field, with the aid of an algorithm, If two or more microphones M1, . . . M5 are combined to form a directional microphone system, it is also possible to produce higher-order directional characteristics whose structure can be matched to more differentiated distributions of interference signal sources.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for suppressing an acoustic interference signal in an incoming audio signal from an acoustic source to a directional microphone system, having at least two microphones, comprising the steps of:

detecting said incoming audio signal with said at least two microphones and, in each of said at least two microphones, producing an output microphone signal therefrom;

generating at least two directional microphone signals by combining the respective output microphone signals with respective weightings, the respective weightings defining a direction-dependent sensitivity distribution of the directional microphone system;

normalizing each of said directional microphone signals with respect to the same sensitivity of the directional microphone system in one direction region, for producing normalized directional microphone signals each having an interference signal component; and selecting one of said normalized directional microphone signals having a lowest interference signal component as an output directional microphone signal.

2. A method as claimed in claim 1 wherein the step of selecting one of said normalized directional microphone signals comprises selecting one of said normalized directional microphone signals having a lowest signal energy as said output signal.

3. A method as claimed in claim 1 comprising selecting the respective weightings for minimizing the sensitivity of the directional microphone system to an interference signal source located in a predetermined direction relative to said directional microphone system.

4. A method as claimed in claim 1 comprising setting the respective weightings dependent on an effect of an acoustic environment in which said directional microphone system is used.

5. A method as claimed in claim 4 comprising setting the respective weightings dependent on the sensitivity of the directional microphone system when disposed on a head or a head simulation.

6. A method as claimed in claim 1 wherein said output microphone signals each have an amplitude and a phase, and comprising setting the respective weightings with at least one of an amplitude factor and a phase factor for respectively correcting at least one of the amplitude and phase of said output microphone signals.

7. A method as claimed in claim 1 comprising storing the respective weightings as characteristics selected from the group consisting of frequency-dependent characteristics and direction-dependent characteristics.

8. A method as claimed in claim 1 comprising storing said respective weightings in a memory and retrieving the respective weightings from said memory for generating said at least two directional microphone signals.

9. A method as claimed in claim 1 comprising generating said at least two directional microphone signals substantially simultaneously.

10. A method as claimed in claim 1 comprising changing the respective weightings between generation of two of said at least two directional microphone signals to successively generate respective directional microphone signals with different direction-dependent sensitivities.

11. A method as claimed in claim 1 wherein said output microphone signals have a frequency range, and comprising subdividing said frequency range into a plurality of frequency bands and, in each of said frequency bands, generating and normalizing said at least two directional microphone signals, and from among all of said frequency bands selecting said one of said normalized directional microphone signals having the lowest interference signal component as said output directional microphone signal.

12. A method as claimed in claim 1 wherein said output microphone signals have a frequency range and comprising subdividing said frequency range into a plurality of frequency bands and, in each frequency band, generating and normalizing said at least two directional microphone signals, and wherein the step of selecting one of said normalized directional microphone signals with the lowest interference signal component as said output directional microphone signal comprises identifying, in each of said frequency bands, one directional microphone signal having the lowest interference signal component, and forming said output directional microphone signal from the respective normalized directional microphone signals with the lowest interference signal component in the respective frequency bands.

13. An apparatus for suppressing an acoustic interference signal in an incoming audio signal comprising:

a directional microphone system having at least two microphones for detecting said incoming audio signal, each of said at least two microphones generating a microphone signal therefrom;

weighting units for respectively weighting said microphone signals with respective weightings for producing at least two directional microphone signals, the respective weightings defining a direction-dependent sensitivity of the directional microphone system;

a normalization unit connected to said weighting units for normalizing the respective directional microphone signals with respect to the same sensitivity of the directional microphone system in one direction region, for producing a plurality of normalized directional microphone signals each having an interference signal component; and a selection unit connected to said normalization unit for selecting one of said normalized directional microphone signals having a lowest interference signal component as an output directional microphone signal.

14. An apparatus as claimed in claim 13 comprising, for each of said microphones, a filter bank connected thereto for subdividing the microphone signal from the microphone connected thereto into a plurality of frequency bands, each frequency band having an output at which a signal component of the microphone signal in that frequency band is present, with respective outputs of the respective filter banks in the same frequency band being connected in pairs to the respective weighting units, and each weighting unit comprising at least one of an amplitude for varying an amplitude of the signal component and a phase unit for shifting the phase of the signal component, for generating, in each of said frequency bands, said at least two directional microphone signals, and wherein said normalization unit normalizes said at least two directional microphone signals in each of said frequency bands for producing said plurality of normalized directional microphone signals, and wherein said selection unit comprises a comparator for comparing all of said normalized directional microphone signals in all of said frequency bands with each other for selecting said one of said normalized directional microphone signals having the lowest interference signal component as said output directional microphone signal.

15. An apparatus as claimed in claim 13 comprising, for each of said microphones, a filter bank connected thereto for subdividing the microphone signal from the microphone connected thereto into a plurality of frequency bands, each frequency band having an output at which a signal component of the microphone signal in that frequency band is present, with respective outputs of the respective filter banks in the same frequency band being connected in pairs to the respective weighting units, and each weighting unit comprising at least one of an amplitude for varying an amplitude of the signal component and a phase unit for shifting the phase of the signal component, for generating, in each of said frequency bands, said at least two directional microphone signals, and wherein said normalization unit normalizes said at least two directional microphone signals in each of said frequency bands for producing said plurality of normalized directional microphone signals, and wherein said selection unit comprises a plurality of comparators respectively for said frequency bands, said comparators, in respective frequency bands, comparing said at least two normalized directional microphone signals in that frequency band with each other to identify, in that frequency band, the normalized directional microphone signal having the lowest interference signal component, and a combination unit connected to said plurality of comparators for forming said output directional microphone signal from the respective normalized directional microphone signals having the lowest interference signal component in the respective frequency bands.

* * * * *